US012757518B2

(12) United States Patent
Nada et al.

(10) Patent No.: US 12,757,518 B2
(45) Date of Patent: Oct. 6, 2026

(54) LIGHT RECEIVING DEVICE

(71) Applicant: NTT, Inc., Tokyo (JP)

(72) Inventors: Masahiro Nada, Musashino (JP); Yasuhiko Nakanishi, Musashino (JP); Shoko Tatsumi, Musashino (JP)

(73) Assignee: NTT, Inc., Tokyo (JP)

( * ) Notice: Subject to any disclaimer, the term of this patent is extended or adjusted under 35 U.S.C. 154(b) by 463 days.

(21) Appl. No.: 18/549,491

(22) PCT Filed: Mar. 17, 2021

(86) PCT No.: PCT/JP2021/010911
§ 371 (c)(1),
(2) Date: Sep. 7, 2023

(87) PCT Pub. No.: WO2022/195780
PCT Pub. Date: Sep. 22, 2022

(65) Prior Publication Data
US 2024/0178331 A1 May 30, 2024

(51) Int. Cl.
*H10F 77/12* (2025.01)
*H10F 77/20* (2025.01)

(52) U.S. Cl.
CPC ........... *H10F 77/12* (2025.01); *H10F 77/206* (2025.01)

(58) Field of Classification Search
CPC ...... H10F 77/12; H10F 77/206; H10F 30/223; H10F 77/14; H10F 77/306; H10F 77/413
See application file for complete search history.

(56) References Cited

U.S. PATENT DOCUMENTS

| | | | | |
|---|---|---|---|---|
| 11,133,427 B2 * | 9/2021 | Iguchi | ................. | H10F 77/1248 |
| 11,916,027 B2 * | 2/2024 | Fuji | ..................... | H01L 23/5225 |
| 2014/0001592 A1 * | 1/2014 | Yamabi | ................... | H10F 77/93 257/466 |
| 2021/0036176 A1 * | 2/2021 | Fujimoto | ................ | H10F 30/20 |
| 2022/0158008 A1 | 5/2022 | Nada et al. | | |

FOREIGN PATENT DOCUMENTS

| | | | |
|---|---|---|---|
| JP | 2014-11347 A | | 1/2014 |
| JP | 2018-98399 A | | 6/2018 |
| JP | 2018098399 A | * | 6/2018 |
| JP | 2020-174079 A | | 10/2020 |
| WO | 2019/193892 A1 | | 10/2019 |

* cited by examiner

*Primary Examiner* — S M Sohel Imtiaz
(74) *Attorney, Agent, or Firm* — Workman Nydegger

(57) ABSTRACT

A light receiving device according to the present disclosure includes an element portion in which at least a first contact layer, a light absorbing layer, and a second contact layer are laminated in this order on a substrate. The substrate and the element portion are covered with a first insulating portion made of, for example, a polymer material. Regarding the substrate surface, a separation portion formed by a second insulating portion perpendicularly to the substrate surface is provided between an element region including an element portion of the light receiving device and a pad region including a pad that electrically and mechanically connects to the outside of the element. Even if the pad in the pad region or the vicinity thereof is damaged by external force, the moisture resistance of the second insulating portion keeps the deterioration of the moisture resistance due to the damage within the pad region.

6 Claims, 6 Drawing Sheets

LIGHT RECEIVING DEVICE

TECHNICAL FIELD

The present invention relates to a light receiving device. More specifically, the present invention relates to a structure of a semiconductor light receiving device.

BACKGROUND ART

The light receiving device has a role of converting incident light into electrical information. In optical communication, a light receiving device is widely used to convert an optical signal propagated through an optical fiber into an electric signal at a reception end of a transmission line.

For application to optical communication, light reception sensitivity and an operation bandwidth of a semiconductor light receiving device configured with a semiconductor have been focused as important parameters among required conditions. If a semiconductor light receiving device has higher light reception sensitivity, an optical signal propagated through a longer distance optical fiber can also be demodulated, which contributes to reduction of relay facilities. Moreover, when a semiconductor light receiving device has a wider bandwidth, an optical signal having a higher modulation speed can be demodulated. Key factors for increasing the speed and reducing the cost of optical communication are increasing the sensitivity and the operating speed of the semiconductor light receiving device.

Among semiconductor light receiving devices, an avalanche photodiode (APD) has an internal gain of the element, and thus can realize higher sensitivity than a general photodiode. For this reason, an APD has been applied to, for example, an optical network such as a metro, an access network, or a huge data center in which it is required to perform transmission over an extended certain distance without relay.

While the transmission distance is extended as described above, optical communication has also been used in short-distance communication such as communication between servers, which has been configured with electric wiring. In an optical transceiver for optical communication using an APD, significant cost reduction is required as compared with the related art.

In general, it is difficult for a semiconductor light receiving device other than the APD to secure reliability against humidity in an actual operation environment. This is because moisture adhering to the surface of the element accelerates degradation of the semiconductor surface, leading to failure of the element. Conventionally, moisture resistance has been secured as the entire optical transceiver by hermetically sealing a semiconductor light receiving device in a package configuring a receiver. However, in order to realize moisture resistance, the package material itself needs first to be made of a material having resistance to humidity, such as metal. Moreover, a complicated step is required for hermetic sealing processing itself, which has hindered cost reduction of the optical transceiver.

CITATION LIST

Patent Literature

Patent Literature 1: JP 2020-174079 A

SUMMARY OF INVENTION

Technical Problem

The present invention proposes a novel configuration for improving moisture resistance in a semiconductor light receiving device.

Solution to Problem

An aspect of the present invention is a light receiving device including an element portion in which at least a first contact layer, a light absorbing layer, and a second contact layer are laminated in this order on a substrate, comprising: a first insulating portion covering the substrate and the element portion; and a separation portion being formed by a second insulating portion perpendicularly to a substrate surface between a pad region and an element region including the element portion, the second insulating portion being made of a material different from a material of the first insulating portion, the pad region including a first pad connected with the first contact layer via an electrode wiring or a second pad connected with the second contact layer via an electrode wiring.

Advantageous Effects of Invention

Reliability of a light receiving device is improved, and cost reduction of an optical transceiver is realized.

DESCRIPTION OF EMBODIMENTS

A light receiving device according to the present disclosure includes an element portion in which at least a first contact layer, a light absorbing layer, and a second contact layer are laminated in this order on a substrate. The substrate and the element portion are covered with a first insulating portion made of, for example, a polymer material. Regarding the substrate surface, a separation portion formed with a second insulating portion perpendicularly to the substrate surface is provided between an element region including an element portion of the light receiving device and a pad region including a pad that electrically and mechanically connects to the outside of the element. The separation portion of the light receiving device may have a wall shape filled with the material of the second insulating portion. Even if the pad in the pad region or the vicinity thereof is damaged by external force, the moisture resistance of the second insulating portion, which may be, for example, an inorganic insulating film, keeps deterioration of the moisture resistance due to the damage within the pad region. The element region including the element portion is maintained in moisture resistance by the second insulating portion without being affected by damage in the pad and the vicinity. The configuration of a passive element including the separation portion can be variously changed.

Hereinafter, a basic configuration and a specific configuration of a light receiving device according to the present disclosure will be described in detail with reference to the drawings.

First Embodiment

Figure 1:
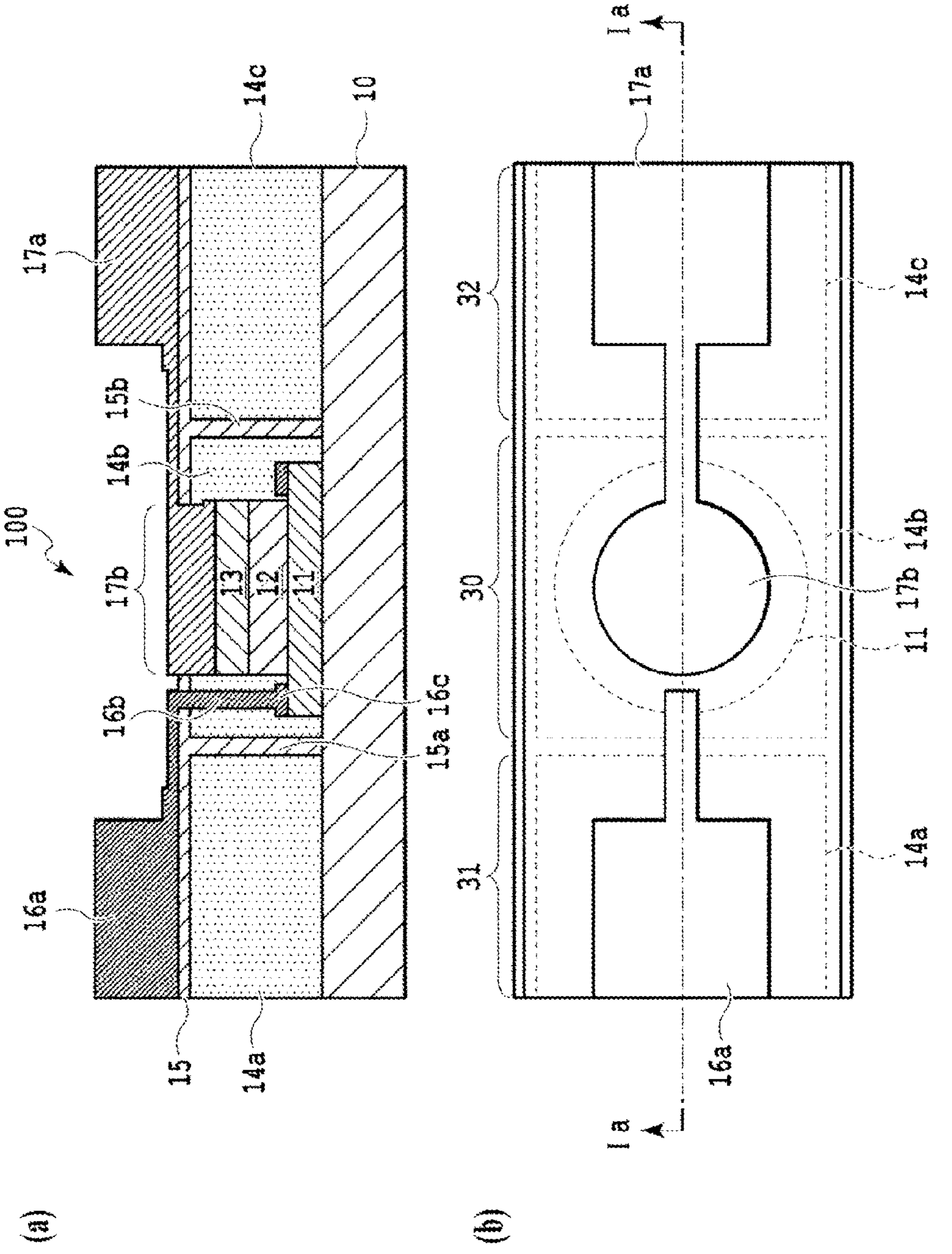
FIG. 1 is a diagram illustrating a configuration of a light receiving device according to First Embodiment.

FIG. 1 is a diagram illustrating a configuration of a light receiving device according to First Embodiment. FIG. 1(*b*) illustrates a top view of a substrate surface, and FIG. 1(*a*) illustrates a cross-sectional view of the substrate surface taken vertically along line Ia-Ia in the top view. Referring to FIG. 1(*a*), a light receiving device 100 has an element portion having a layer structure in which an n-type InP contact layer 11, an undoped InGaAs light absorbing layer 12, and a p-type InP contact layer 13 are laminated in this order on an InP substrate 10. A mirror film 17*b* for reflection made of Au is formed on the p-type contact layer 13, and the mirror film 17*b* for reflection also serves as an electrode to the p-type contact layer 13. The element portion has a substantially cylindrical shape, and the n-type contact layer 11 is formed slightly larger than the light absorbing layer 12 and the p-type contact layer 13. A ring-shaped electrode metal 16*c* made of Au is formed around the upper surface of the cylinder made of the n-type contact layer 11.

The electrode 16*c* on the n-type contact layer 11 is connected with a first electrode pad 16*a* for extracting an electric signal to the outside via an electric wiring 16*b* formed perpendicular to the substrate surface. Moreover, the electrode 17*b* is connected with a second electrode pad 17*a* for extracting an electric signal to the outside via electric wiring.

The photoelectric conversion operation of the light receiving device 100 according to the present embodiment is similar to that of the related art. Electrons generated by photoexcitation in the light absorbing layer 12 reach the n-type contact layer 11 and then move to the electrode 16*c*. On the other hand, the holes reach the p-type contact layer 13 and then move to the electrode 17*b*. As described above, the present light receiving device 100 operates as a semiconductor light receiving device that generates a current when light enters the light absorbing layer 13. The light enters the substrate 10 from the lower surface side, reaches the light absorbing layer 12, and is reflected to the light absorbing layer 12 by the mirror film 17*b* for reflection also serving as an electrode, and the incident light is efficiently converted into an electric signal.

The light receiving device according to the present disclosure improves moisture resistance of the semiconductor light receiving device itself and realizes cost reduction of the optical transceiver by the characteristic element protection structure described in detail below. The element portion including the n-type contact layer 11, the light absorbing layer 12, and the p-type contact layer 13, and the substrate 10 are entirely covered with first insulating portions 14*a*, 14*b*, and 14*c* formed of a first material. For example, a polymer can be used as the first material, and the first insulating portion functions as an insulating film for element protection. Furthermore, the entirety of the first insulating portions 14*a*, 14*b*, and 14*c* is covered with a second insulating portion 15 made of the second material. For example, SiN can be used as the second material, and the second insulating portion 15 functions as a protective insulating film for the first insulating portion and the element portion. The two pads 16*a* and 17*a* on the outermost surface are both formed on the second insulating portion 15.

In the light receiving device according to the present disclosure, regarding the substrate surface, a pad region 31 including a first pad 16*a* and an element region 30 including the element portion are separated by a part of the second insulating portion. Specifically, referring to the cross-sectional view of FIG. 1(*a*), pad regions 31 and 32 and the element region 30 are separated from each other by wall-shaped second insulating portions 15*a* and 15*b* formed perpendicular to the substrate 10. Referring also to the top view of FIG. 1(*b*), the first insulating portion is separated into the two parts 14*a* and 14*b* indicated by dotted lines by the wall-shaped second insulating portion 15*a*, and the first insulating portion 14*a* of the pad region 31 and the first insulating portion 14*b* of the element region 30 are not directly connected with each other.

Similarly, the pad region 32 including the second pad 17*a* and the element region 30 including the element portion are also separated from each other by the wall-shaped second insulating portion 15*b* formed perpendicular to the substrate 10. The first insulating portion 14*c* of the pad region 32 and the first insulating portion 14*b* of the element region 30 are separated from each other by the second insulating portion 15*b*, and are not directly connected with each other.

In order to use the light receiving device in a state of not being hermetically sealed, the light receiving device itself needs to have moisture resistance. As the second insulating portion 15 to cover the uppermost portion of the light receiving device according to the present embodiment, for example, an inorganic insulating film such as SiN in which the film itself is dense with respect to water molecules is used. However, such an inorganic insulating film does not have sufficient strength against mechanical stress.

Figure 6:
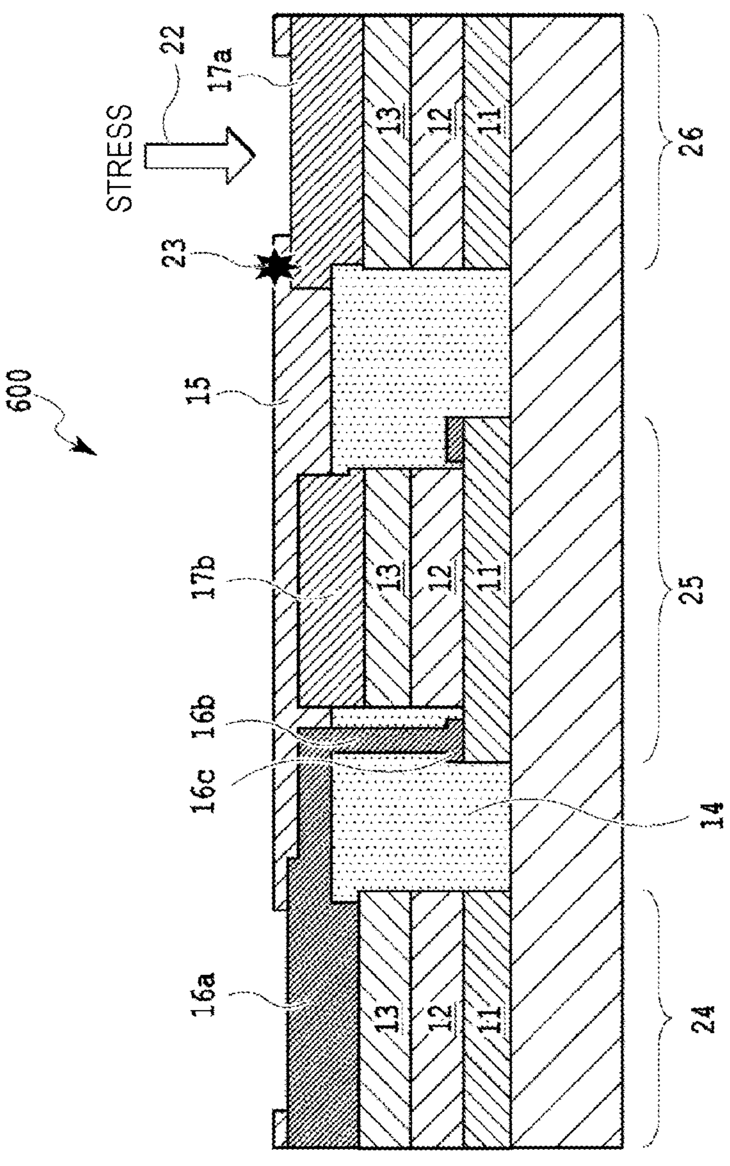
FIG. 6 is a diagram for explaining an influence of mechanical stress applied to a pad on moisture resistance of a light receiving device.

FIG. 6 is a diagram for explaining the influence of mechanical stress on the pad on the moisture resistance of the element. A light receiving device 600 in FIG. 6 has an element portion having the same structure as the light receiving device 100 according to First Embodiment. The pad region including the pads 16*a* and 17*a* also has substantially the same configuration as the light receiving device 100 according to First Embodiment except that the base is not an insulating portion but has the same laminated structure as the element portion. The difference in configuration from the light receiving device according to First Embodiment is that an element region 25 and pad regions 24 and 26 are separated from each other only by an insulating portion 14. When the light receiving device is actually used, it is necessary to further extract an electric signal from the pad to the outside by bringing a test probe into contact with the pads 16*a* and 17*a*, bonding a metal wire, or the like. When an electric path (wiring) to the outside is formed, the insulating portion 15 around the pad may be mechanically broken by the stress 22. In particular, when a microcrack 23, which is minute damage, is generated in the insulating portion (insulating film) around the pad, moisture intrudes from the damaged part and the moisture resistance is broken even if the microcrack is minute.

Polymer-based materials to be used also as interlayer insulating films for metal wiring generally have moisture permeability. For this reason, in the element configuration in FIG. 6, moisture intruding through the microcrack 23 reaches the element portion via the insulating portion 14 made of the polymer-based material, and the reliability of the light receiving device is impaired.

In the light receiving device 100 according to the present embodiment, the first insulating portion made of the polymer-based material covering the substrate 10 and the element portion is spatially separated into the part 14*b* of the element region 30 and the parts 14*a* and 14*c* of the pad regions 31 and 32. In the light receiving device 100, the first insulating portion is separated by the separation portions 15*a* and 15*b* which are a part of the second insulating portion made of SiN covering the uppermost portion and formed in a wall shape perpendicular to the substrate surface. According to the element protection structure of First Embodiment in FIG. 1, even if the moisture resistance is broken due to slight damage of the pad region, moisture is blocked by the separation portion between the element region 30 and the pad regions 31 and 32, and the moisture resistance of the element portion is not broken. Even if damage occurs due to stress applied to the pad region, the moisture resistance of the element portion can be secured, and the reliability of the light receiving device itself can be improved. As a result, the moisture resistance structure of the optical transceiver can be further simplified, and cost reduction can be realized.

Therefore, a light receiving device according to the present disclosure can be implemented as a light receiving device 100 including an element portion in which at least a first contact layer 11, a light absorbing layer 12, and a second contact layer 13 are laminated in this order on a substrate 10, the light receiving device including: a first insulating portion covering the substrate and the element portion; and separation portions 15*a* and 15*b* being formed by a second insulating portion perpendicularly to a substrate surface between pad regions 31 and 32 and the element region 30 including the element portion, the second insulating portion being made of a material different from a material of the first insulating portion, the pad regions 31 and 32 including a first pad 16*a* connected with the first contact layer via an electrode wiring or a second pad 17*a* connected with the second contact layer via an electrode wiring.

Moreover, the separation portions 15*a* and 15*b* described above can be each implemented as a portion having a wall shape filled with the material of the second insulating portion.

The steps for realizing the light receiving device according to the present embodiment are as follows. First, an n-type InP contact layer, an undoped InGaAs light absorbing layer, and a p-type InP contact layer are epitaxially grown in this order on a semi-insulating InP substrate 10 by a metal organic chemical vapor deposition (MOCVD) method. After the three layers are crystal-grown, photolithography and etching are sequentially performed. As a result, a mesa-shaped element portion including the n-type contact layer 11, the light absorbing layer 12, and the p-type contact layer 13 is formed.

Then, electrode metals 17*b* and 16*c* are formed respectively on the p-type contact layer 13 and the n-type contact layer 11 by photolithography, vapor deposition, and lift-off. Thereafter, by applying polyimide, photolithography, and curing using a photosensitive polyimide, a through hole of polyimide (first material) for forming the n-type contact electrode 16*b*, the p-type contact electrode, and the separation portion is formed later. Here, the through hole is not limited to a cylindrical hole but also includes a groove-shaped hole having a width. Furthermore, by forming SiN (second material) over the entirety, the protective film 15 of SiN is formed including the separation portions 15*a* and 15*b* which are a part of the second insulating portion. Thereafter, through holes are formed in SiN for the n-type contact electrode 16*b* and the p-type contact electrode 17*b* by dry etching. Finally, the metal wiring and the pads 16*a* and 17*a* may be formed by photolithography and vapor deposition lift-off.

Although an example in which pad regions are provided on both sides of the element region and three regions are arranged on a straight line has been described in the configuration of the light receiving device illustrated in FIG. 1, the configuration of the light receiving device is not limited thereto. For example, two pads may be on the same side with respect to the element region, and two pads may be configured in one common first insulating portion. In the case of such a configuration, the two separation portions 15*a* and 15*b* in FIG. 1 may be a single unit. Moreover, three regions of the element region and the two pad regions may be arranged in an L shape.

Even if the light receiving device having the element protection structure according to the present embodiment deteriorates in moisture resistance due to damage of the pad peripheral portion, this deterioration can be kept only within the pad region, and the moisture resistance of the element portion is maintained. Furthermore, the moisture resistance of the optical transceiver is improved, and simplification of the structure of the optical transceiver and cost reduction are realized. The configuration of the separation portion that separates the element region and the pad region can be variously changed other than the configuration illustrated in FIG. 1.

Second Embodiment

Figure 2:
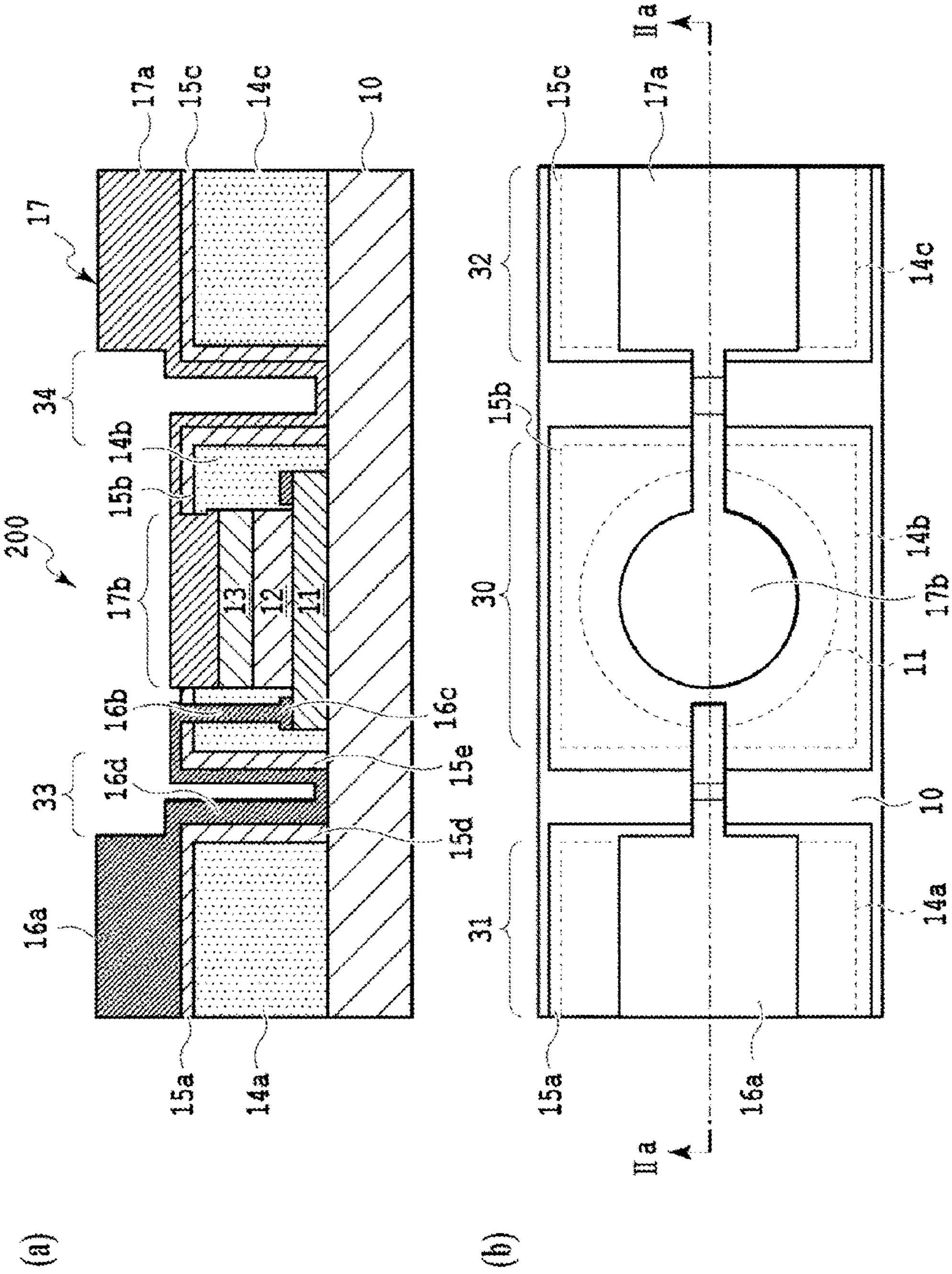
FIG. 2 is a diagram illustrating a configuration of a light receiving device according to Second Embodiment.

FIG. 2 is a diagram illustrating a configuration of a light receiving device according to Second Embodiment. FIG. 2(*b*) illustrates a top view of the substrate surface, and FIG. 2(*a*) illustrates a cross-sectional view of the substrate surface taken vertically along line IIa-IIa in the top view. A light receiving device 200 according to the present embodiment is different from the light receiving device 100 according to First Embodiment illustrated in FIG. 1 only in the configuration of the separation portion, and only this difference will be described below. In the light receiving device 100 according to First Embodiment, the separation portion that separates the element region and the pad region is formed as a part of the second insulating portion that covers the uppermost surface of the element and has a wall shape perpendicular to the substrate surface. This separation portion is formed by a step of forming a through hole in a groove shape in the first insulating portion and filling the groove with the material of the second insulating portion. Through this step, the entire surface of the light receiving device according to First Embodiment is covered with the second insulating portion except for a part where the pad is formed. However, most of the chip does not necessarily need to be covered with the second insulating portion.

In the light receiving device 200 according to the present embodiment, the element region and the pad region have second insulating portions 15*a*, 15*b*, 15*c*, 15*d*, and 15*e* that cover the upper surfaces of the respective first insulating portions and the side surfaces perpendicular to the substrate surfaces. The second insulating portion 15*e* that covers the side surface of the first insulating portion of an element region 30, and the second insulating portion 15*d* that covers the side surface of the first insulating portion of a pad region 31 including a pad 16*a* face each other and are separated from each other by a space. A pad region 32 including a pad 17 and the element region 30 have a similar configuration. As is clear from FIGS. 2(*a*) and 2(*b*), each of separation portions 33 and 34 includes two second insulating portions facing each other perpendicular to the substrate surface and a space therebetween. Note that the entire element is covered with the third insulating portion after all the elements and the wiring electrodes are formed, and only the pad part is exposed, so that higher resistance to environment can be imparted to the light receiving device as described last. In this case, a space between the two second insulating portions facing each other in the separation portions 33 and 34 in FIG. 2 is filled with the insulating material of the third insulating portion instead of space (air).

Accordingly, in the light receiving device according to the present embodiment, the separation portion 33 can also be implemented by including the film-like second insulating portion 15*d* that covers the side surface of the pad region 31 and the film-like second insulating portion 15*e* that covers the side surface of the element region 30.

The steps for realizing the light receiving device according to the present embodiment are as follows. First, an n-type InP contact layer, an undoped InGaAs light absorbing layer, and a p-type InP contact layer are epitaxially grown in this order on a semi-insulating InP substrate 10 using an MOCVD method. After the three layers are crystal-grown, photolithography and etching are sequentially performed. As a result, a mesa-shaped light receiving device including an n-type contact layer 11, a light absorbing layer 12, and a p-type contact layer 13 is formed.

Then, electrode metals 17*b* and 16*c* are formed respectively on the p-type contact layer 13 and the n-type contact layer 11 by photolithography, vapor deposition, and lift-off. Thereafter, by applying polyimide, photolithography, and curing using a photosensitive polyimide, a through hole is formed on a polyimide 14*b* in the element region 30 in order to form an n-type contact electrode 16*b* and the p-type contact electrode later. At the same time, each region of the first insulating portion is formed so that the polyimide 14*b* of the element region 30 and polyimides 14*a* and 14*c* of the pad regions 31 and 32 have separated island shapes. Furthermore, the second insulating portion, that is, SiN is formed over the entirety, and the protective films 15*a*, 15*b*, and 15*c* of SiN are formed including the separation portions 15*d* and 15*e* that are a part of the second insulating portion. Thereafter, through holes are formed in SiN for the n-type contact electrode 16*b* and the p-type contact electrode 17*b* of the element by dry etching. At the same time, a pattern of SiN is formed so that the element region 30 and the pad regions 31 and 32 have a separated island shape. Finally, metal wirings and the pads 16*a* and 17*a* having a predetermined thickness may be formed by photolithography and vapor deposition lift-off.

In the light receiving device 200 having the element protection structure according to the present embodiment, the deterioration of the moisture resistance due to damage of the pad peripheral portion can also be kept only within the pad region, and the moisture resistance of the element portion is also maintained. The moisture resistance of an optical transceiver is improved, and simplification of the structure of the optical transceiver and cost reduction are realized.

Third Embodiment

In the present embodiment, a configuration for further improving moisture resistance and reliability is presented with respect to the element protection structure of the light receiving device described in Second Embodiment.

Figure 3:
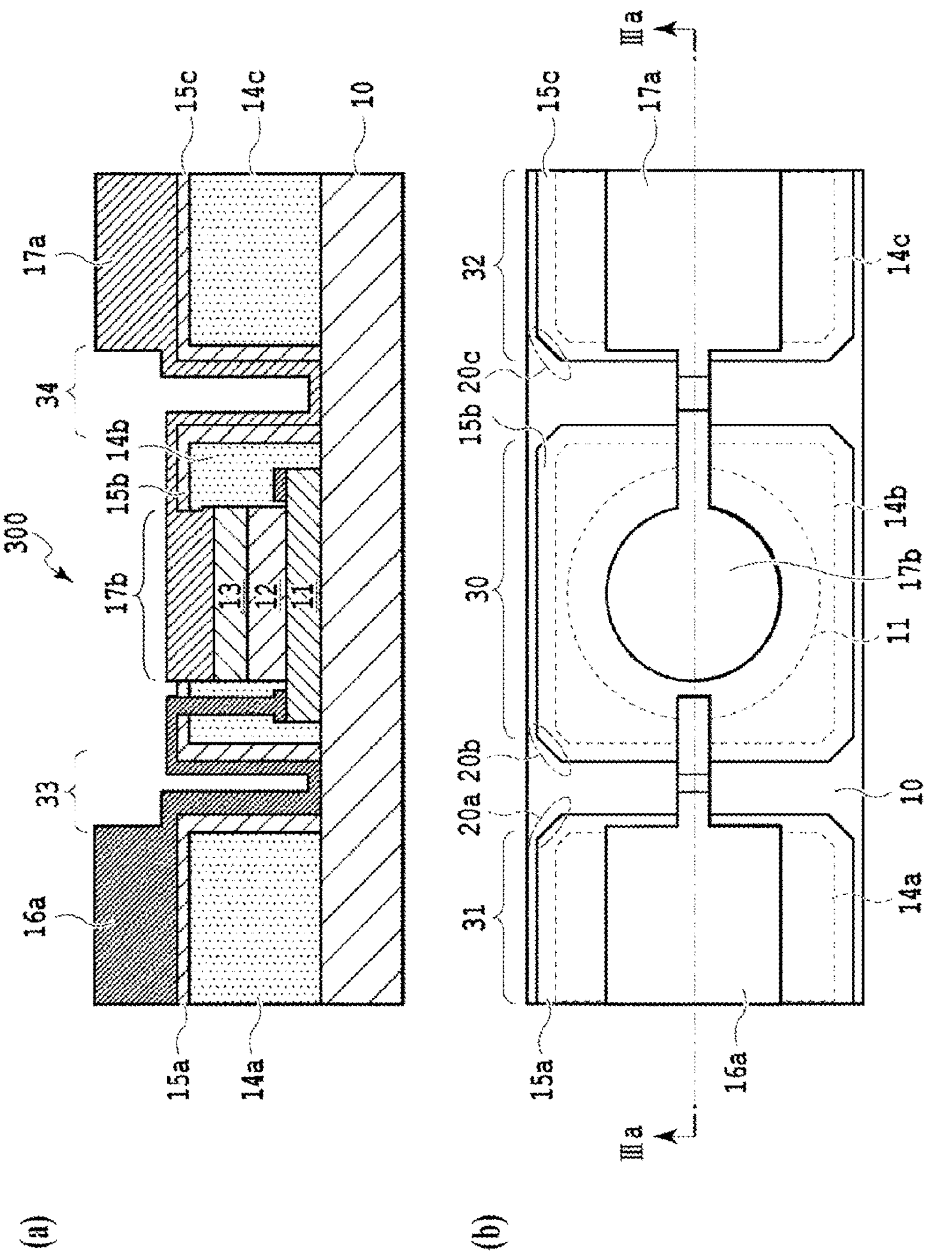
FIG. 3 is a diagram illustrating a configuration of a light receiving device according to Third Embodiment.

FIG. 3 is a diagram illustrating a configuration of a light receiving device according to Third Embodiment. FIG. 3(*b*) illustrates a top view of the substrate surface, and FIG. 3(*a*) illustrates a cross-sectional view of the substrate surface taken vertically along line IIIa-IIIa in the top view. A light receiving device 300 according to the present embodiment is different from the light receiving device 200 according to Second Embodiment illustrated in FIG. 2 only in the upper surface patterns of the first insulating portion and the second insulating portion, and only the difference from Second Embodiment will be described below. The configuration in the cross-sectional view of FIG. 3(*a*) is exactly the same as that of FIG. 2(*a*). In the light receiving device 300 in FIG. 3, the pattern shape of the upper surface of the first insulating portion or the second insulating portion when the substrate surface is viewed is such that the internal angle formed by the two sides is larger than 90 degrees at any position.

In FIG. 3(*a*) that is a cross-sectional view taken along line IIIa-IIIa along the wiring electrode, the configurations of separation portions 33 and 34 that separate an element region 30 from pad regions 31 and 32 are the same as those in FIG. 2(*a*). Referring to the top view in FIG. 3(*b*), the upper surface pattern of the second insulating portion covering the element region 30 and the pad regions 31 and 32 is not rectangular as in Second Embodiment, but has oblique sides 20*a*, 20*b*, and 20*c* with short corner parts.

Any light receiving device according to the present disclosure has a configuration in which the first insulating portion or the second insulating portion is separated between the element region and the pad region, thereby improving moisture resistance in the element portion. The effect of improving the moisture resistance is based on the premise that the first insulating portion and the second insulating portion are firmly in close contact with the substrate and the semiconductor layer. However, a contact part with the InP-based semiconductor layer may actually rise and a gap may be generated in both a polymer-based insulating film and an inorganic insulating film such as SiN. This problem may be caused by a thermal cycle at the time of use in a manufacturing process, an actual optical transceiver, or the like, a mechanical impact due to water washing or the like in a manufacturing process, or the like. Such rising of the insulating film often occurs at an end portion of the film where the stress of the insulating film is concentrated. Accordingly, as the angle formed by the end portion of the insulating film pattern is sharper, the stress concentrates more and the rising tends more to occur.

In the light receiving device 300 according to the present embodiment, the pattern shape of the first insulating portion or the second insulating portion when the substrate surface is viewed is set such that the internal angle formed by any two adjacent sides is larger than 90 degrees as illustrated in FIG. 3(*b*). Specifically, in the manufacturing step of the light receiving device according to Second Embodiment described above, the four corners of the island pattern of the first insulating portion of the surface (upper surface) parallel to the substrate surface may be cut off to form an octagonal shape in each of the element region 30 and the pad regions 31 and 32. In this case, the internal angle of the pattern shape of each region is 135 degrees. Similarly, the shape of SiN of the second insulating portion is an octagon. Although it is preferable to form a pattern shape in which an internal angle formed by any two adjacent sides is larger than 90 degrees with respect to both the first insulating portion and the second insulating portion in order to prevent concentration of stress, a pattern shape may be formed in only one of the insulating portions.

In the light receiving device 300 according to the present embodiment, the deterioration of the moisture resistance due to damage around the pad can also be kept only within the pad region, and the moisture resistance of the element portion is also maintained. Reliability of the light receiving device alone can be further improved by making the structure of the insulating portion more rigid against stress. Furthermore, the moisture resistance of the optical transceiver is improved, and simplification of the structure of the optical transceiver and cost reduction are realized.

Fourth Embodiment

Regarding a light receiving device according to the present embodiment, an example in which an end portion of the pattern of a surface (upper surface) parallel to the substrate surfaces of the first insulating portion and the second insulating portion is circular in the element protection structure of the light receiving device illustrated in Third Embodiment described above is presented.

Figure 4:
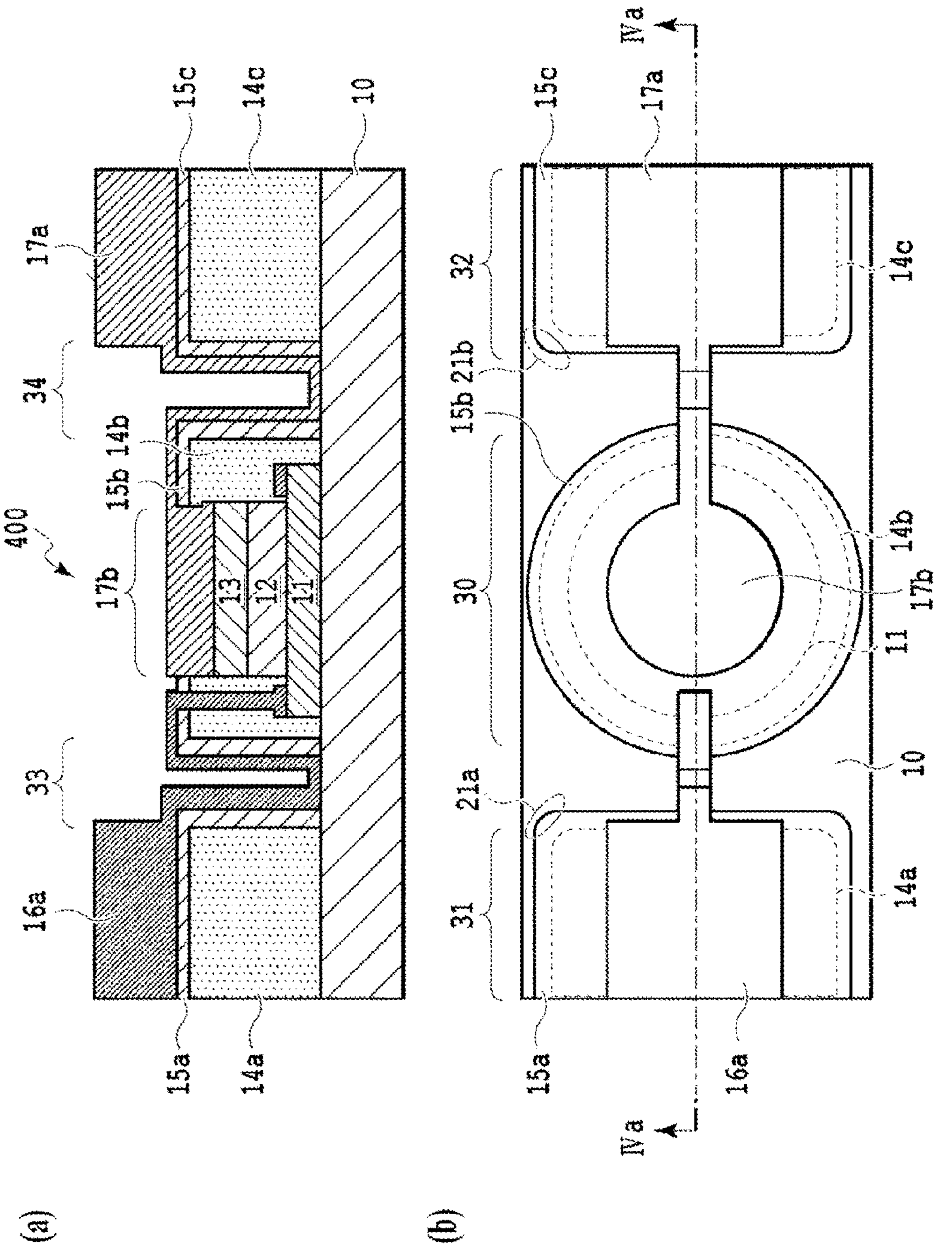
FIG. 4 is a diagram illustrating a configuration of a light receiving device according to Fourth Embodiment.

FIG. 4 is a diagram illustrating a configuration of a light receiving device according to Fourth Embodiment. FIG. 4(*b*) illustrates a top view of the substrate surface, and FIG. 4(*a*) illustrates a cross-sectional view of the substrate surface taken vertically along line IVa-IVa in the top view. A light receiving device 400 according to the present embodiment is the light receiving device 300 according to Third Embodiment illustrated in FIG. 3 except that the shape of each corner of the pattern of the first insulating portion or the second insulating portion when the substrate surface is viewed is changed from the oblique side into a curved surface. As illustrated in FIG. 4(*b*), four corners of the pattern of the second insulating portions 15*a* and 15*c* are curved surfaces 21*a* and 21*b* in a surface parallel to the substrate surfaces of pad regions 31 and 32.

Moreover, the patterns of the first insulating portion and the second insulating portion in the element region 30 are circular in a surface parallel to the substrate surface so as to enclose the cylindrical mesa of the element portion, and the sizes of the first insulating portion and the second insulating portion are limited so as to conform to the shape and size of the element portion. Since an element region 30 in FIG. 4 has a cylindrical shape having no vertex, the concentration of stress on the element portion can be further reduced as compared with the case of the element region 30 in FIGS. 1 to 3 based on the rectangular parallelepiped shape in First to Third Embodiments. The light receiving device 400 according to the present embodiment can be realized by a step according to Third Embodiment only by changing the upper surface patterns of the first insulating portion and the second insulating portion.

In the light receiving device 400 according to the present embodiment, the deterioration of the moisture resistance due to damage of the pad peripheral portion can also be kept only within the pad region, and the moisture resistance of the element portion is also maintained. Similarly to Third Embodiment, the reliability of the light receiving device can be further improved by making the structure of the insulating portion more rigid against stress. Furthermore, the moisture resistance of the optical transceiver is improved, and simplification of the structure of the optical transceiver and cost reduction are realized.

Fifth Embodiment

A light receiving device according to Fifth Embodiment is different from the light receiving devices according to Second to Fourth Embodiments in the positional relationship between the pad on the surface of the element and the second insulating portion that covers the outermost surface of the element. In the element protection structures of the light receiving devices described in Second to Fourth Embodiments, the element region and the pad region are formed in separated island shapes by providing the separation portion or restricting the shape of the element region. Since the first insulating portion and the second insulating portion are removed in the region between the element region and the pad region, the substrate 10 is exposed. In the light receiving device according to the present embodiment, the second insulating portion is formed between the wiring and the substrate at every position of the element and the wiring to be formed.

Figure 5:
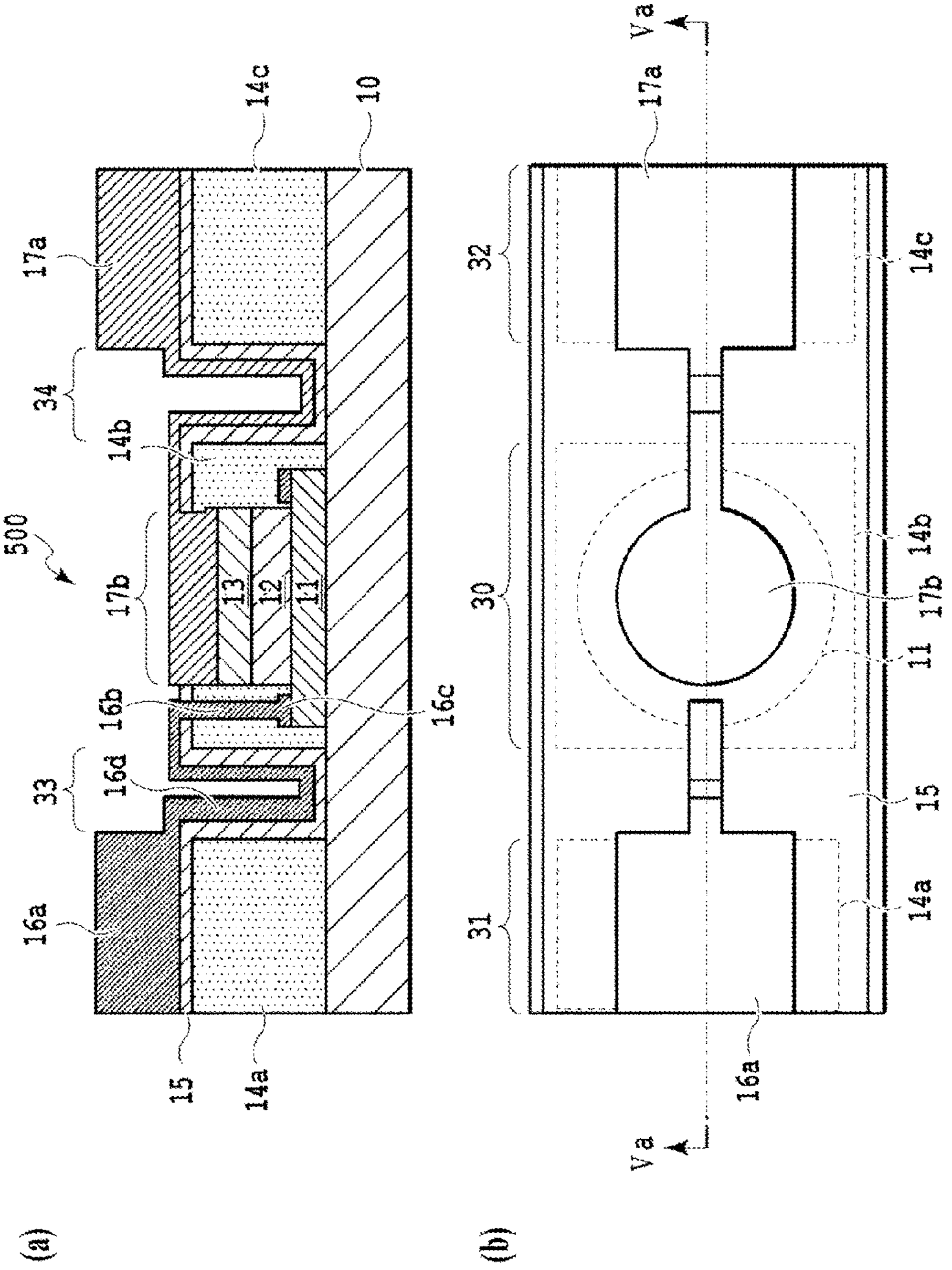
FIG. 5 is a diagram illustrating a configuration of a light receiving device according to Fifth Embodiment.

FIG. 5 is a diagram illustrating a configuration of a light receiving device according to Fifth Embodiment. FIG. 5(*b*) illustrates a top view of the substrate surface, and FIG. 5(*a*) illustrates a cross-sectional view of the substrate surface taken vertically along line Va-Va in the top view. A light receiving device 500 according to the present embodiment is different from the light receiving device 200 according to Second Embodiment illustrated in FIG. 2 in the positional relationship between the second insulating portion and the wiring.

In the light receiving devices according to Second to Fourth Embodiments, the first insulating portion and the second insulating portion are spatially separated between the element region 30 and the pad regions 31 and 32. Therefore, a part of the wiring between the element portion and the pads 16*a* and 17 is formed on the substrate 10.

In general, in a substrate, a surface level is formed on a semiconductor surface by various wet/dry etching, a lithography step, or the like, and charges may be accumulated. When a wiring is formed on the substrate in such a state, a leakage current may be generated along the substrate. The leakage current may lead to deterioration of performance and reliability of the light receiving device. Therefore, in the light receiving device 500 according to the embodiment, the second insulating portion is formed between wiring formed in the final process and a substrate 10. When the respective cross-sectional views are compared between FIG. 2(*a*) and FIG. 5(*a*), wirings to the pad 16*a* and the pad 17*a* are directly formed on the substrate 10 in the separation portions 33 and 34 according to Second Embodiment. On the other hand, in the light receiving device according to the present embodiment, the second insulating portion 15 is integrally formed on the entire surface without a break through a pad region 31, an element region 30, and a pad region 32. In separation portions 33 and 34, wirings to a pad 16*a* and a pad 17*a* are formed on a second insulating portion 15. With this configuration, the surface level of the metal electrode does not affect the substrate 10. The leakage current due to the wiring portion can be reduced by the second insulating portion formed between the substrate and the wiring.

The steps for realizing the light receiving device according to the present embodiment are as follows. First, an n-type InP contact layer, an undoped InGaAs light absorbing layer, and a p-type InP contact layer are epitaxially grown in this order on a semi-insulating InP substrate using an MOCVD method. After the three layers are crystal-grown, photolithography and etching are sequentially performed. As a result, a mesa-shaped light receiving device including an n-type contact layer 11, a light absorbing layer 12, and a p-type contact layer 13 is formed.

Then, electrode metals 17*b* and 16*c* are formed respectively on the p-type contact layer 13 and the n-type contact layer 11 by photolithography, vapor deposition, and lift-off. Thereafter, by applying polyimide, photolithography, and curing using a photosensitive polyimide, a through hole is formed on a polyimide **14*b* in the element region 30 in order to form an n-type contact electrode 16*b* and the p-type contact electrode later. At the same time, each region of the first insulating portion is formed so that the polyimide 14*b* of the element region 30 and polyimides 14*a* and 14*c* of the pad regions 31 and 32 have separated island shapes. Furthermore, after the second insulating portion, that is, SiN is formed on the entirety, through holes of SiN for the n-type contact electrode 16*c* and the p-type contact electrode are formed by dry etching. By this step, the first insulating portion is separated between the pad regions 31 and 32 and the element region 30, and the influence on the moisture resistance of the element due to damage of the pad region is avoided. Furthermore, the second insulating portion 15 is formed over the entire surface of the substrate 10**.

Finally, the metal wiring and the pads **16*a* and 17*a*** may be formed by photolithography and vapor deposition lift-off.

Although polyimide has been described as an example of the material of the first insulating portion and SiN has been described as an example of the material of the second insulating portion in the light receiving devices according to First to Fifth Embodiments described above, the element protection structure of the light receiving device according to the present disclosure is not limited only to these materials. For example, the first insulating portion may be benzocyclobutene (BCB). Moreover, the second insulating portion may be $SiO_2$, WSiN, or a multilayer film thereof.

Moreover, after all the elements and the wiring are formed, the entire element can be covered with a third insulating portion (insulating film) separately from the first insulating portion and the second insulating portion, and only the pad part can be exposed, so that high resistance to environment is further imparted to the element.

Although PIN photodiode all having the circular element portions has been described as an example in the above embodiments, an avalanche photodiode having higher sensitivity may be used. Moreover, the shape of the element portion may also be an elliptical shape or a polygonal shape according to the shape of the beam entering the light receiving device or a circumstance in manufacturing the element.

Moreover, in each of the above embodiments, it has been described that light perpendicularly enters the substrate from below. However, considering that each is a light receiving device of an optical waveguide type, the structure of the element portion may have a rectangular shape or the like so that incidence from the optical waveguide along the substrate surface is easy. A light receiving device according to the present disclosure has a characteristic configuration of a plurality of insulating portions with respect to the element region and the pad region, and does not depend on the type and structure of the element portion as the light receiving device.

With a light receiving device according to the present disclosure, high reliability can be achieved by the light receiving device alone, and cost reduction of the optical transceiver can be achieved without requiring a hermetic sealing structure.

The invention claimed is:

1. A light receiving device including an element portion in which at least a first contact layer, a light absorbing layer, and a second contact layer are laminated in this order on a substrate, comprising:

a first insulating portion covering the substrate and the element portion; and a separation portion being formed by a second insulating portion perpendicularly to a substrate surface between a pad region and an element region including the element portion, the second insulating portion being made of a material different from a material of the first insulating portion, the pad region including a first pad connected with the first contact layer via an electrode wiring or a second pad connected with the second contact layer via an electrode wiring, wherein the second insulating portion has a pattern shape including an internal angle larger than 90° in a surface parallel to the substrate.

2. The light receiving device according to claim 1, wherein the first insulating portion is covered with the second insulating portion.

3. The light receiving device according to claim 1, wherein the separation portion has a wall shape filled with the material of the second insulating portion.

4. The light receiving device according to claim 1, wherein entirety except the first pad and the second pad is covered with the second insulating portion.

5. A light receiving device including an element portion in which at least a first contact layer, a light absorbing layer, and a second contact layer are laminated in this order on a substrate, comprising:

a first insulating portion covering the substrate and the element portion; and a separation portion being formed by a second insulating portion perpendicularly to a substrate surface between a pad region and an element region including the element portion, the second insulating portion being made of a material different from a material of the first insulating portion, the pad region including a first pad connected with the first contact layer via an electrode wiring or a second pad connected with the second contact layer via an electrode wiring, wherein the element portion has a cylindrical mesa structure, and the light receiving device is a semiconductor light receiving device that is connected with the second pad and has a reflective electrode formed on the second contact layer.

6. A light receiving device including an element portion in which at least a first contact layer, a light absorbing layer, and a second contact layer are laminated in this order on a substrate, comprising:

a first insulating portion covering the substrate and the element portion; and a separation portion being formed by a second insulating portion perpendicularly to a substrate surface between a pad region and an element region including the element portion, the second insulating portion being made of a material different from a material of the first insulating portion, the pad region including a first pad connected with the first contact layer via an electrode wiring or a second pad connected with the second contact layer via an electrode wiring, wherein the first insulating portion is made of a polymer material, and the second insulating portion is made of an inorganic insulating material including any one of SiN, $SiO_2$, and WSiN, or a multilayer film of SiN, $SiO_2$, and WSiN.

* * * * *